United States Patent
Imamura et al.

(10) Patent No.: US 9,991,236 B2
(45) Date of Patent: Jun. 5, 2018

(54) LED LAMP DEVICE HAVING A FLUORESCENT ELEMENT SHAPED FOR UNIFORM LIGHT CONVERSION

(71) Applicant: Panasonic Intellectual Property Management Co., Ltd., Osaka (JP)

(72) Inventors: Hiroshi Imamura, Osaka (JP); Ryoji Yokotani, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 322 days.

(21) Appl. No.: 14/795,439

(22) Filed: Jul. 9, 2015

(65) Prior Publication Data

US 2016/0005719 A1 Jan. 7, 2016

Related U.S. Application Data

(63) Continuation of application No. 12/878,168, filed on Sep. 9, 2010, now Pat. No. 9,099,333.

(30) Foreign Application Priority Data

Sep. 9, 2009 (JP) .................. 2009-208431

(51) Int. Cl.
*F21V 9/00* (2018.01)
*H01L 25/075* (2006.01)
(Continued)

(52) U.S. Cl.
CPC ........ *H01L 25/0753* (2013.01); *H01L 33/486* (2013.01); *H01L 33/505* (2013.01);
(Continued)

(58) Field of Classification Search
CPC ............ F21V 19/047; F21Y 2113/007; F21Y 2105/001; F21Y 2101/02; H01J 9/006
See application file for complete search history.

(56) References Cited

U.S. PATENT DOCUMENTS 3,875,456 A * 4/1975 Kano .................. G08G 1/095
257/89
7,858,408 B2 * 12/2010 Mueller .................. B29C 41/14
257/E21.504
(Continued)

FOREIGN PATENT DOCUMENTS

JP 2002299694 10/2002
JP 2007227679 9/2007
(Continued)

*Primary Examiner* — David Porta
*Assistant Examiner* — Djura Malevic
(74) *Attorney, Agent, or Firm* — Patterson Intellectual Property Law P.C.; Gary L. Montle; Jerry Turner Sewell

(57) ABSTRACT

An LED lamp device includes a plurality of LED elements separately mounted on a substrate and effective to emit light having a first wavelength. A fluorescent element includes a fluorescent material excitable by light emitted from the LED elements to emit light of a second wavelength, and is arranged to cover each LED element with no gaps provided between the fluorescent element and the substrate. The fluorescent element is shaped in accordance with the positioning of the LED elements and the spaces defined therebetween such that a proportion of light of the first wavelength with respect to light of the second wavelength is substantially uniform irrespective of light exit direction.

3 Claims, 4 Drawing Sheets

(51) Int. Cl.
 *H01L 33/50* (2010.01)
 *H01L 33/48* (2010.01)
 *H01L 33/58* (2010.01)

(52) U.S. Cl.
 CPC .......... *H01L 33/508* (2013.01); *H01L 33/58* (2013.01); *H01L 2924/0002* (2013.01)

(56) References Cited

U.S. PATENT DOCUMENTS

| | | | |
|---|---|---|---|
| 7,858,409 B2 * | 12/2010 | Kessels | G02F 1/133609 257/89 |
| 7,956,366 B2 | 6/2011 | Hiroyama et al. | |
| 2002/0183603 A1 * | 12/2002 | Yamamoto | A61B 5/1455 600/323 |
| 2005/0117334 A1 * | 6/2005 | Lee | H01L 25/0753 362/231 |
| 2005/0151147 A1 * | 7/2005 | Izuno | H01L 33/505 257/98 |
| 2005/0224821 A1 * | 10/2005 | Sakano | B29C 67/08 257/79 |
| 2005/0244993 A1 * | 11/2005 | Bogner | H01L 33/501 438/22 |
| 2006/0022211 A1 * | 2/2006 | Yatsuda | H01L 25/0753 257/98 |
| 2006/0102914 A1 * | 5/2006 | Smits | H01L 33/54 257/98 |
| 2006/0171152 A1 * | 8/2006 | Suehiro | H01L 33/56 362/363 |
| 2007/0228390 A1 | 10/2007 | Hattori et al. | |
| 2008/0048200 A1 * | 2/2008 | Mueller | B29C 41/14 257/98 |
| 2008/0231169 A1 * | 9/2008 | Hata | H01B 1/10 313/500 |
| 2010/0308354 A1 * | 12/2010 | David | H01L 33/507 257/98 |
| 2011/0031516 A1 * | 2/2011 | Basin | H01L 33/507 257/98 |
| 2012/0176489 A1 * | 7/2012 | Oshiro | G02B 21/002 348/80 |

FOREIGN PATENT DOCUMENTS

| | | |
|---|---|---|
| JP | 2007273562 | 10/2007 |
| JP | 2009088054 | 4/2009 |
| JP | 2009088054 A * | 4/2009 |
| JP | 2010278266 | 12/2010 |

* cited by examiner

LED LAMP DEVICE HAVING A FLUORESCENT ELEMENT SHAPED FOR UNIFORM LIGHT CONVERSION

CROSS-REFERENCES TO RELATED APPLICATIONS

This application is a continuation of co-pending U.S. patent application Ser. No. 12/878,168 entitled "LED Lamp Device Having a Fluorescent Element Shaped for Uniform Light Conversion" filed Sep. 9, 2010, which claims the benefit of Japanese Patent Application No. 2009-208431, filed Sep. 9, 2009, both of which are incorporated herein in their entireties.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to a light-emitting diode ("LED") lamp device using a plurality of LED elements. More particularly, the present invention relates to an LED lamp device having a fluorescent element disposed about a plurality of LED elements and shaped or formed so as to emit light of substantially uniform color.

LED lamp devices such as shown in FIG. 6, and as conventionally known in the art, may generally have a plurality of LED elements 20 mounted on a mounting substrate 10 for improved luminous intensity. The LED elements 20 are covered without any intervening space by a fluorescent element 30 formed of a translucent material containing or otherwise dispersed with a fluorescent material. In particular, an LED lamp device which uses a blue LED (i.e., an LED element effective to emit "blue" light in a short-wavelength range) and which uses a fluorescent element effective to convert blue light radiated from the blue LED into yellow light has been found to be useful as a white light source.

However, in the conventional example described above, the fluorescent element 30 is formed in such a manner that a thickness of a light-emitting unit 50 including the LED elements 20 and the fluorescent element 30 becomes uniform without depending on a location of the LED elements, thus causing color unevenness. Specifically, comparison of light path lengths of blue light B1 to B3 (see FIG. 6) radiated from the blue LED element 20 until it is radiated to outside of the fluorescent element 30 shows that the light path length of B1 or B3 radiated laterally with respect to the LED element 20 (or more particularly with respect to the surface of the substrate) is relatively long, while the light path length of B2 radiated outwardly with respect to the LED element 20 (or more particularly with respect to the substrate) in the figure is relatively short. The proportion of light radiated thereby from the LED element 20 and then converted into yellow light depends on a light path length of this light until it is radiated to the outside of the fluorescent element 30. Therefore, for light radiated from immediately above the LED element 20, the proportion of the converted light is small and thus a ratio of blue light is large, while for light radiated from a peripheral edge portion of the fluorescent element 30 or a space portion between the LED elements 20 the proportion of the converted light is large and thus a ratio of yellow light is large. This may produce a color difference (color unevenness) depending on a location with respect to the light-emitting unit 50.

An LED lamp device as previously known in the art (and as shown for example in FIG. 7) may seek to address this problem by providing a fluorescent material sheet 31 which is disposed along the top surfaces of a plurality of LED elements 20 mounted with a space there-between, and which has grooved sections 44 individually formed at regions covering the spaces between the LED elements 20. An adhesive agent 21 may be provided between the sheet 31 and the LED elements 20. A light path length of light (B1) radiated from the top surface of the LED element 20 toward the grooved section 44 and outside of the fluorescent material sheet 31 is shorter than that of the example previously described and as shown in FIG. 6, and is substantially equal to a light path length of light (B2) radiated from the top surface of the LED element 20 directly outward and to the outside of the fluorescent body sheet 31. Thus, the ratio of blue light and yellow light becomes substantially uniform without depending on a location along a surface of the fluorescent material sheet 31, which can therefore suppress color unevenness.

However, in the example shown in FIG. 7, the top surfaces of the LED elements 20 are merely covered by the sheet-like fluorescent material sheet 31, thus forming an air layer 22 between the LED elements 20. Thus, there is a risk that part of the light emitted from a side surface of the LED element 20 is lost as a result of being subjected to, for example, multiple reflections between the side surfaces of the LED elements 20, and generally resulting in reduced luminous efficiency.

BRIEF SUMMARY OF THE INVENTION

An LED lamp device is provided in accordance with one or more aspects of the present invention to reduce color unevenness and maintain a high luminous efficiency.

In one embodiment, the LED lamp device includes a plurality of LED elements separately mounted on a substrate and effective to emit light having a first wavelength. A fluorescent element includes a fluorescent material excitable by light emitted from the LED elements to emit light of a second wavelength, and is arranged to cover each LED element with no gaps provided between the fluorescent element and the substrate. The fluorescent element is shaped in accordance with the positioning of the LED elements and the spaces defined there-between such that a proportion of light of the first wavelength with respect to light of the second wavelength is substantially uniform irrespective of light exit direction.

In another embodiment, an LED lamp device in accordance with the present disclosure includes a mounting substrate, a plurality of light-emitting elements mounted on the mounting substrate separately from each other, and a fluorescent element. The fluorescent element includes a fluorescent material excitable by light of a first color radiated from the light-emitting element to radiate light of a second color, and is arranged to cover all surfaces of the light-emitting element excluding a surface mounted on the mounting substrate, with no space provided between the fluorescent element and the light-emitting element. The fluorescent element is thereby also disposed in spaces between the light-emitting elements with no air gap provided between the fluorescent element and the mounting substrate. On surfaces of the fluorescent element covering the spaces, a grooved section is provided along end surfaces of the light-emitting elements defining the space.

In another embodiment, an LED lamp device as disclosed herein includes a substrate having a mounting surface and a plurality of LED elements mounted on the surface of the substrate with a space defined between each adjacent LED element. The LED elements are effective to emit light having a first wavelength. A fluorescent element includes a fluorescent material excitable by light emitted from the LED elements to emit light of a second wavelength, and is arranged to cover each LED element with no gaps provided between the fluorescent element and the surface of the substrate. The fluorescent element has a plurality of side surfaces extending perpendicular to a surface of the substrate upon which the LED elements are positioned, and an outer surface parallel with the surface of the substrate. A plurality of inclined surfaces extend from the outer surface of the fluorescent element to an edge of an associated side surface, and one or more grooved sections are arranged along each space between the plurality of LED elements. The fluorescent element is thereby shaped in accordance with the positioning of the LED elements and the spaces defined there-between are such that a proportion of light of the first wavelength with respect to light of the second wavelength is substantially uniform irrespective of light exit direction.

DETAILED DESCRIPTION OF THE INVENTION

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

An embodiment of an LED lamp device in accordance with the present invention may now be described with reference to FIGS. 1 to 3. In the following description, top to bottom with respect to the sectional view in FIG. 1 may generally be defined as a vertical direction, but this is merely intended for reference purposes only and is not limiting in any way, as the same direction may be horizontal in actuality if the LED lamp device were otherwise mounted.

Figure 2:
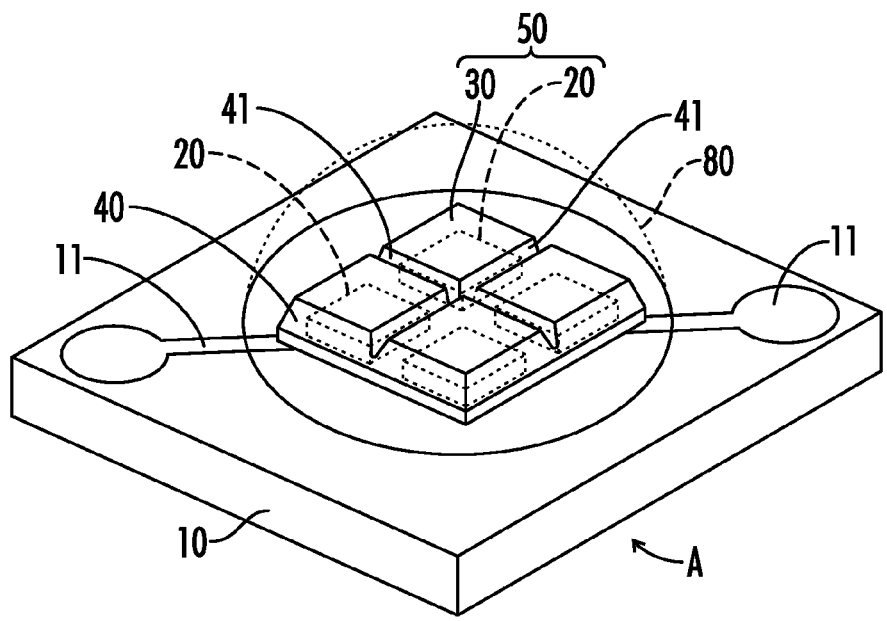
FIG. 2 is a perspective view of the LED lamp device of FIG. 1.
Figure 3A:
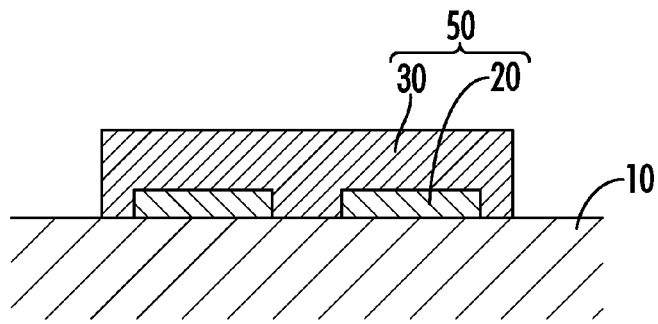
FIGS. 3(a), (b), (c), and (d) are sectional diagrams illustrating one embodiment of a method of forming the fluorescent element of FIG. 1.
Figure 3B:
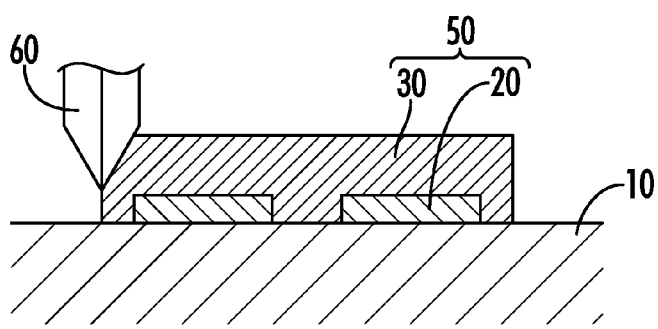
Figure 3C:
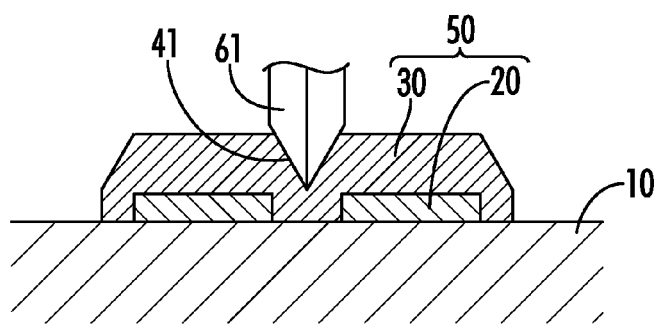
Figure 3D:
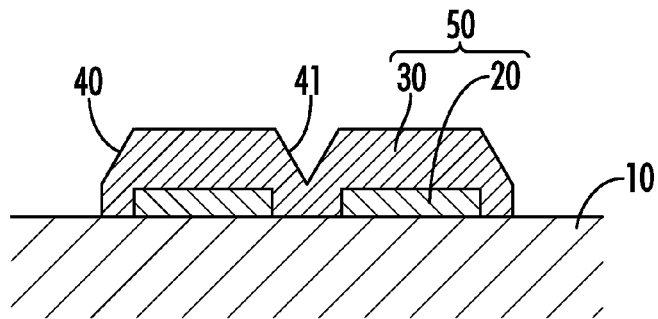

An LED lamp device A in an embodiment as shown in FIG. 2 may include a flat mounting substrate 10, a plurality of LED elements 20 (four shown in FIG. 2) mounted with a space therebetween on a first side (or otherwise stated a top surface) of the mounting substrate 10. A fluorescent element 30, which includes a fluorescent material excitable by a first light radiated from each of the LED elements 20 to radiate a second light of a color different from that of the first light, is arranged in such a form as to cover and/or enclose all the LED elements 20 on the top surface of the mounting substrate 10. A transparent housing 80 or lens 80 (indicated by a broken line in FIG. 2) of a dome-like shape may be arranged so as to cover the fluorescent element 30 on the top surface of mounting substrate 10. The LED lamp device A in an embodiment so described may be further said to include one or more such light emitting units 50 each having a plurality of LED elements 20 and one fluorescent element 30.

The mounting substrate 10 may be formed of a high heat radiating material, such as for example copper, aluminum, or the like, with for example a sub-mounted alumina substrate or aluminum nitride, and may be formed into a substantially flat shape. On the top surface side thereof, a wiring pattern 11 (only part of the wiring pattern 11 is shown in FIG. 2) may be formed in a manner as is well known in the art.

The LED elements 20 may be blue LED elements of, for example, a GaN group each of which is of a substantially rectangular solid shape and radiates blue light from a top surface and a side surface thereof, and are arranged on the mounting substrate 10 with spaces therebetween. The LED elements 20 may be mounted on the mounting substrate 10 while electrically connected to the wiring pattern 11 by any of various packaging means as are known in the art (not shown) to perform, for example, wire bonding after flip chip mounting, die bonding, etc.

Figure 1:
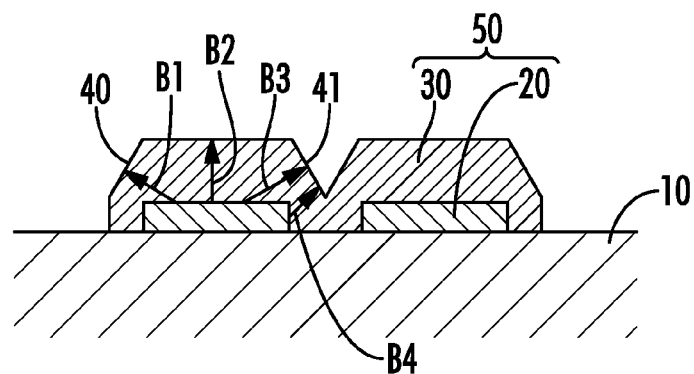
FIG. 1 is a sectional view of an embodiment of an LED lamp device of the present invention.

The fluorescent element 30, as shown in FIG. 1, may be disposed in such a manner as to cover each of the LED elements 20 without any space provided between the fluorescent body 30 and the LED elements 20, or in other words so as to leave substantially no air gaps. The fluorescent element 30 may have inclined surfaces 40 of a planar shape, each formed on a side surface thereof, and grooved sections 41 of a substantially V-shaped configuration each formed at a region covering the spaces between the LED elements 20. The process of disposing or positioning the plurality of LED elements 20 on the mounting substrate 10 may necessarily form a space between a side end surface of one LED element 20 and a side end surface of another LED element 20 along these side end surfaces, and the grooved section 41 of the fluorescent element 30 may be provided along or otherwise corresponding to the side end surfaces of the LED elements 20 forming this space.

The fluorescent element 30 may be formed by evenly dispersing, within or among a thermal cured silicon resin material, a granulous or powdered yellow fluorescent material excitable by blue light radiated from the LED element 20 to radiate yellowish light (i.e., light of a relatively long wavelength with respect to blue light). Therefore, the LED lamp device A of such an embodiment radiates from a surface of the fluorescent element 30 the blue light radiated from the LED element 20 and the yellow light obtained through light conversion by the yellow fluorescent material, whereby white light can be provided With reference to FIG. 3, an example of a method of forming the fluorescent element 30 may now be described briefly. First, the fluorescent element 30 may, by a molding method or a screen printing method (both methods are well known in the art and thus are omitted from the present description), be formed into a substantially rectangular solid shape while covering the plurality of LED elements 20 mounted on the mounting substrate 10 (see FIG. 3(*a*)).

Next, by using for example a rotating cutting blade 60, an inclined surface 40 may be formed on one or more side surfaces of the fluorescent element 30 (see FIG. 3(*b*)). The inclined surface 40 is shown only in cross-section with respect to one side in FIG. 3, but may generally be formed along the side surfaces of the fluorescent element 30 as is shown for example in FIG. 2.

Similarly, by using the rotating cutting blade 60, one or more grooved sections 41 may be formed in V-shaped configurations along portions of the fluorescent element 30 covering the space between the LED elements 20 (FIG. 3(*c*)).

The inclined surface 40 may be formed along all side surfaces of the fluorescent element 30, and the grooved section 41 formed at each space between the plurality of LED elements 20. The order in which the inclined surfaces 40 and the grooved sections 41 are formed is irrelevant, as either of them may come first in various embodiments of the procedure.

Through the procedures described above, the fluorescent element 30 provided with the inclined surfaces 40 and the grooved sections 41 may be formed (see FIG. 3(*d*)).

The procedures of forming the inclined surfaces 40 and the grooved sections 41 by a cutting method has been described above, but the fluorescent element 30 of a shape as shown in FIG. 2 may otherwise be formed at once by a molding method with a mold of a shape that permits the formation of the inclined surfaces 40 and the grooved sections 41.

A transparent housing 80 or lens 80 may be provided to improve the efficiency of light extraction from the fluorescent element 30. The lens 80 may, in one embodiment, be formed of, for example, translucent thermal cured silicon resin formed into a dome-like shape, which is then disposed in such a manner as to cover the entire fluorescent element 30 on the top surface of the mounting substrate 10. Note that the material of the transparent lens 80 is not limited to the silicon resin, and thus may be, for example, epoxy resin, glass, or an equivalent thereof within the scope of the present disclosure.

In the LED lamp device A of the present embodiment, by forming the inclined surfaces 40 and the grooved sections 41 about the fluorescent element 30 as shown in FIG. 1, various light path lengths for light radiated from the LED element 20 (denoted by arrows B1 to B4) to the outside of the fluorescent element 30 may be substantially uniform without being dependent on the direction in which the light exits the LED element 20. Thus, the proportion of blue light to be converted into yellow light may become substantially uniform without depending on the light exit direction, and therefore the ratio between the blue light and the yellow light may become substantially uniform without depending on a location along the surface of the fluorescent element 30, which further suppresses color unevenness. Moreover, because the fluorescent element 30 is also disposed along or within the one or more spaces between the LED elements 20, light (B4) radiated from the side surfaces of the LED elements 20 is also radiated to the outside by being converted into yellow light by the fluorescent material in the fluorescent element 30 disposed along or within the space portion, whether by being dispersed or otherwise. This light further contributes to light emission, thus permitting an improvement in the luminous efficiency.

The LED lamp device A as shown in FIG. 2 is provided with four LED elements 20, but the number of LED elements 20 is not so limited and may otherwise be any number equal to or larger than 2.

Moreover, the fluorescent material in the fluorescent element 30 is not limited to the yellow fluorescent material but a plurality of kinds of fluorescent materials may be used for the purpose of color adjustment, improving color rendering properties, etc. For example, in one embodiment, a red fluorescent body and a green fluorescent body can be used to provide white light with a high color rendering property.

Moreover, the LED element 20 is not limited to the blue LED element previously described and thus, for example, an LED element radiating ultraviolet light may be provided and a blue fluorescent material and a yellow fluorescent material may be contained in the fluorescent element 30 to thereby provide white light from the light emitting unit 50.

Furthermore, white is illustrated as a color of light emitted from the light emitting unit 50 in an embodiment as previously described, but the color of the light emitted from the light emission unit 50 is not limited to a whitish color. In this case, a red LED element, a green LED element, or the like may be used as the LED element 20.

Moreover, the shape of the inclined surface 40 is not limited to the planar shape previously described, and thus may be a curved shape or an equivalent within the scope of the present disclosure. The shape of the grooved section 41 is likewise not limited to the V-shaped configuration previously described and thus may have a U-shape or an equivalent within the scope of the present invention.

Figure 4A:
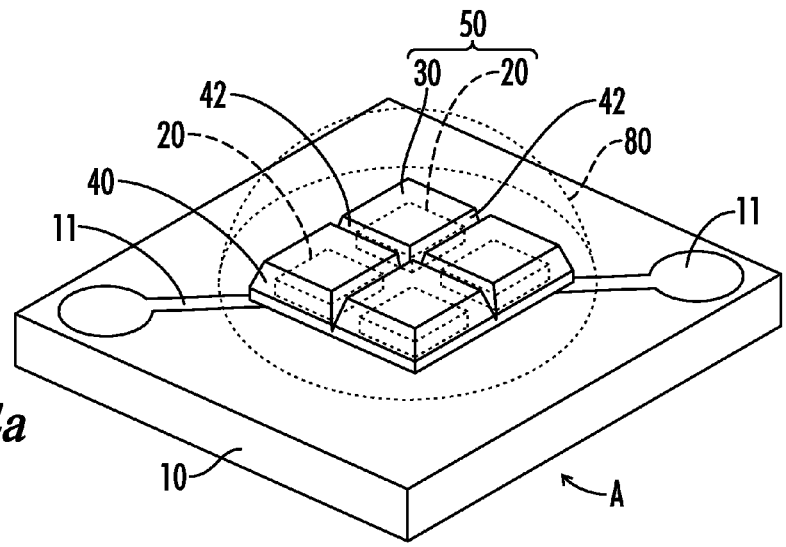
FIG. 4(a) is a perspective view of another embodiment of the LED lamp device of the present invention.
Figure 4B:
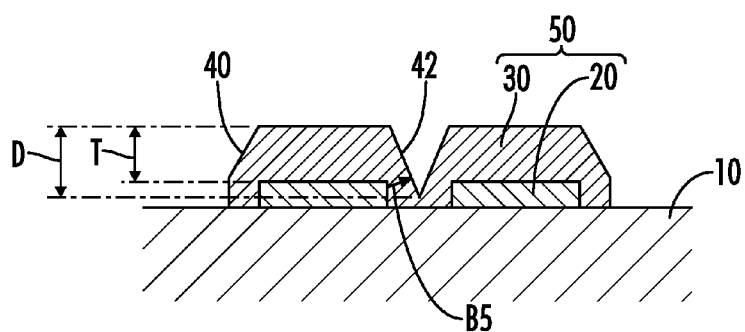
FIG. 4(b) is a sectional view of the LED lamp device of FIG. 4(a).

With reference now to FIGS. 4*a* and 4*b*, in another embodiment the LED lamp device has a similar configuration as that previously described except that a depth D of a grooved section 42 may be formed deeper than a thickness T of a fluorescent element 30 above LED elements 20, and thus common components are provided with the same numerals and omitted from the description.

From the LED element 20, light is radiated from not only a top surface thereof (e.g., a surface substantially parallel with the surface of the substrate) but also a side surface thereof (e.g., a surface substantially perpendicular to the surface of the substrate). In one embodiment, the depth D of the grooved section 42 is formed to be greater than the thickness T of the fluorescent element 30 disposed on the top surface of the LED element 20. This permits control of the light path length of light radiated laterally from the side surface of the LED element 20 to outside of the fluorescent element 30, thus permitting increased control of a proportion of this light converted into yellow light in the fluorescent element 30. Therefore, a greater color unevenness suppressing effect can be provided than that provided in a case where the depth D of the grooved section 42 is less than the thickness T of the fluorescent element 30 disposed on the top surface of the LED element 20.

Figure 5:
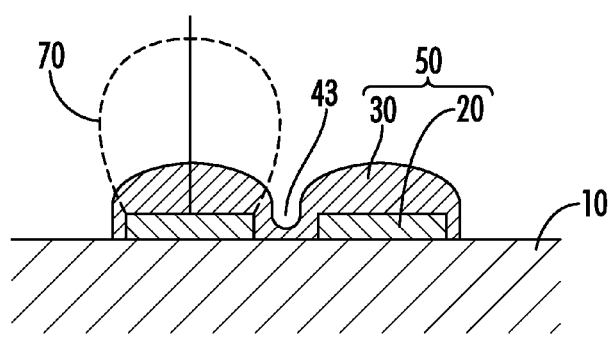
FIG. 5 is a sectional view of another embodiment of the LED lamp device of the present invention.
Figure 6:
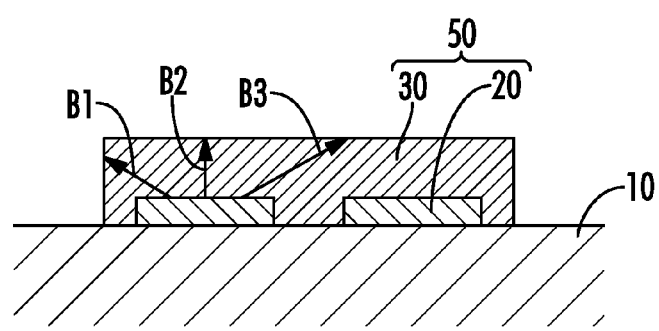
FIG. 6 is a sectional view of an example of an LED lamp device as previously known in the art.
Figure 7:
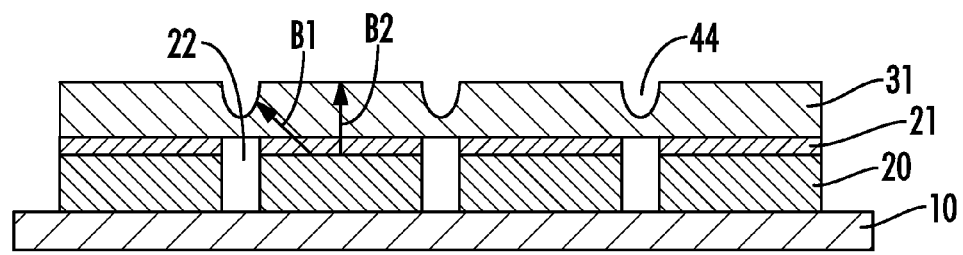
FIG. 7 is a sectional view of another example of an LED lamp device as previously known in the art.

With reference now to FIG. 5, in another embodiment the LED lamp device may have a similar configuration as those previously described except with respect to a shape of the fluorescent element 30, and thus common components are provided with the same numerals and thus omitted from the description.

The light distribution 70 of the LED element 20 may be generally strong around a center of the LED element 20 and become increasingly weaker toward the peripheral sides thereof, as illustrated by a curved surface shown by the broken line in FIG. 5. In one embodiment, the thickness of the fluorescent element 30 may be changed in accordance with this light distribution 70. As a result of forming the fluorescent element 30 in such a manner, at a region where the intensity of blue light radiated from the LED element 20 is relatively strong, the thickness of the fluorescent element 30 may be made large, and the intensity of light converted into yellow light at the fluorescent element 30 is correspondingly strong. Conversely, at a region where the intensity of the blue light radiated from the LED element 20 is relatively weak, the thickness of the fluorescent element 30 may be made small, and thereby the intensity of the light converted into yellow light at the fluorescent element 30 may also be made weak. Consequently, the ratio of the yellow light obtained by light conversion at the fluorescent element 30 with respect to non-converted blue light becomes uniform without depending on a location along the surface of the fluorescent element 30, which can substantially eliminate color unevenness.

A fluorescent element 30 in accordance with an embodiment as shown in FIG. 5 may be fabricated by, for example, a molding method further making use of a prefabricated mold having the desired shape.

Thus, although there have been described particular embodiments of the present invention of a new and useful LED LAMP DEVICE HAVING A FLUORESCENT ELEMENT SHAPED FOR UNIFORM LIGHT CONVERSION, it is not intended that such references be construed as limitations upon the scope of this invention except as set forth in the following claims.

What is claimed is:

1. An LED lamp device comprising:
    a mounting substrate;
        a plurality of light-emitting elements mounted on the mounting substrate, said light-emitting elements being arranged in a plurality of rows and a plurality of columns, the light-emitting elements further spaced separately from each other with spaces between adjacent light-emitting elements, each light-emitting element having a distal surface disposed away from the mounting substrate; and
    a fluorescent element comprising a fluorescent material excitable by light of a first color radiated from the light-emitting element to radiate light of a second color, wherein
        the fluorescent element is formed continuously over the plurality of light-emitting elements to cover the light-emitting elements and to fill the spaces left between adjacent light-emitting elements with no air gap provided between the light-emitting elements, and
        the fluorescent element has a distal surface in a plane substantially parallel to the mounting substrate, the distal surface divided into a plurality of flat distal surface areas, each distal surface area being positioned over a respective light-emitting element and having a geometry selected to correspond to the geometry of the respective light-emitting element, each distal surface area separated from an adjacent distal surface area by a depressed portion of the fluorescent element positioned over one or more of the spaces between adjacent light-emitting elements.

2. An illumination device comprising:
a mounting substrate;
a plurality of light-emitting diode (LED) chips mounted on the mounting substrate, the LED chips positioned separately from each other with gaps between adjacent LED chips, each LED chip having a respective mounting surface in contact with the mounting substrate; and
a fluorescent body part formed of a translucent material that fluoresces to convert light radiated from the LED chips into light of a color different from a color of the radiated light, the fluorescent body part covering all surfaces of each LED chip except for the respective mounting surface of each LED chip, the fluorescent body part positioned with no space between the fluorescent body part and the covered surfaces of the LED chips, the fluorescent body part extending to the mounting substrate to fill the gaps between adjacent LED chips, the fluorescent body part having an outer surface in a plane parallel to the mounting substrate;
wherein
    the outer surface of the fluorescent body part includes a plurality of grooves, each groove aligned with at least a respective one of the gaps between adjacent LED chips, the plurality of grooves including at least a first groove perpendicular to at least a second groove, and
    the plurality of grooves define a plurality of flat areas on the outer surface of the fluorescent body part, each flat area parallel to the mounting substrate, each flat area having a shape conforming to a shape of one of the LED chips.

3. The illumination device as defined in claim 2, further comprising a single transparent lens configured to cover the fluorescent body part.

* * * * *